United States Patent [19]

Anthony et al.

[11] Patent Number: 4,958,592
[45] Date of Patent: Sep. 25, 1990

[54] RESISTANCE HEATER FOR DIAMOND PRODUCTION BY CVD

[75] Inventors: Thomas R. Anthony, Schenectady; Robert C. DeVries, Burnt Hills; Richard A. Engler; Robert H. Ettinger, both of Schenectady; James F. Fleischer, Scotia, all of N.Y.

[73] Assignee: General Electric Company, Schenectady, N.Y.

[21] Appl. No.: 234,773

[22] Filed: Aug. 22, 1988

[51] Int. Cl.$^5$ .............................................. C23C 16/46
[52] U.S. Cl. .................................. 118/724; 118/725; 118/728; 156/613; 156/614; 156/DIG. 68; 248/325; 248/364; 427/55
[58] Field of Search ............... 118/728, 725, 724, 715; 427/38, 50, 55; 156/613, 614, DIG. 68; 423/446; 422/247; 16/194, 196; 248/325, 364

[56] References Cited

U.S. PATENT DOCUMENTS 4,434,188  2/1984  Kamo et al. ........................ 427/39

FOREIGN PATENT DOCUMENTS 58-153324  9/1983  Japan ............................ 118/620
9050092  3/1984  Japan ............................ 118/715
60-202929  10/1985  Japan ............................ 118/723
61-171120  8/1986  Japan ............................ 118/722

Primary Examiner—Norman Morgenstern
Assistant Examiner—Terry J. Owens
Attorney, Agent, or Firm—William H. Pittman; James C. Davis, Jr.

[57] ABSTRACT

A plural substrate CVD apparatus for diamond crystal production utilizes spaced apart vertical, parallel, planar substrate panels with an electrical (direct current, D.C.) resistance filament heater therebetween. A hydrogen-hydrocarbon gas mixture flows between panels to come into contact with the heater and the panels to cause diamond crystal nucleation and growth on the substrate panels. The apparatus includes means for maintaining the spaced relationship of the heater from the substrate surfaces, comprising a rod member attached to one end of the heater and tensioned by a cable passing over a pulley member and attached to a weight.

8 Claims, 3 Drawing Sheets

1

RESISTANCE HEATER FOR DIAMOND PRODUCTION BY CVD

BACKGROUND OF THE INVENTION

This invention relates to an improved CVD apparatus for the nucleation and growth of diamond crystals, and more particularly, to a CVD apparatus utilizing parallel spaced apart vertical substrate panels with an electrical direct current resistance heating element therebetween.

PRIOR ART

In copending application, Ser. No. 944,729, filed Dec. 22, 1986, an apparatus and process are disclosed in which a hydrogen/hydrocarbon gas mixture is activated by being concurrently subjected to microwave energy and contact with an electrical resistance tungsten wire heater at its incandescent temperature. The activated gas mixture is then caused to come into contact with a preferred material substrate to cause diamond crystal nucleation and growth on the substrate. The noted copending application also refers to U.S. Pat. No. 4,434,188—Kamo which discloses separate application of microwave and heat energy to activate a hydrogen-hydrocarbon gas mixture. The gas mixture is brought into contact with a heated substrate to cause diamond crystal nucleation and growth on the substrate.

The process described is referred to as a chemical vapor deposition, CVD, process. A problem associated with the CVD process of producing diamond crystals relates to the relatively low yield of diamond crystals from each process cycle.

OBJECTS OF THE INVENTION

It is an object of this invention to provide an improved apparatus for the practice of a diamond crystal producing CVD process therein.

It is another object of this invention to provide an improved diamond CVD apparatus for an increase in mass yield of diamond crystal from a CVD cycle.

It is still another object of this invention to provide an improved diamond CVD apparatus having a significantly increased substrate surface area for increased diamond crystal nucleation and growth thereon.

These and other objects and advantages of this invention will be better understood when taken in connection with the following drawings and description.

BRIEF SUMMARY OF THE INVENTION

An improved substrate having an increased surface area on which diamond crystals are nucleated and grown in a CVD apparatus comprises a plurality of vertical panel members in spaced apart, planar, parallel, and opposite relationship to each other with an intermediate linear and parallel electrical, direct current resistance heater serving adjacent opposite panels.

DESCRIPTION OF A PREFERRED EMBODIMENT OF THE INVENTION

Figure 1:
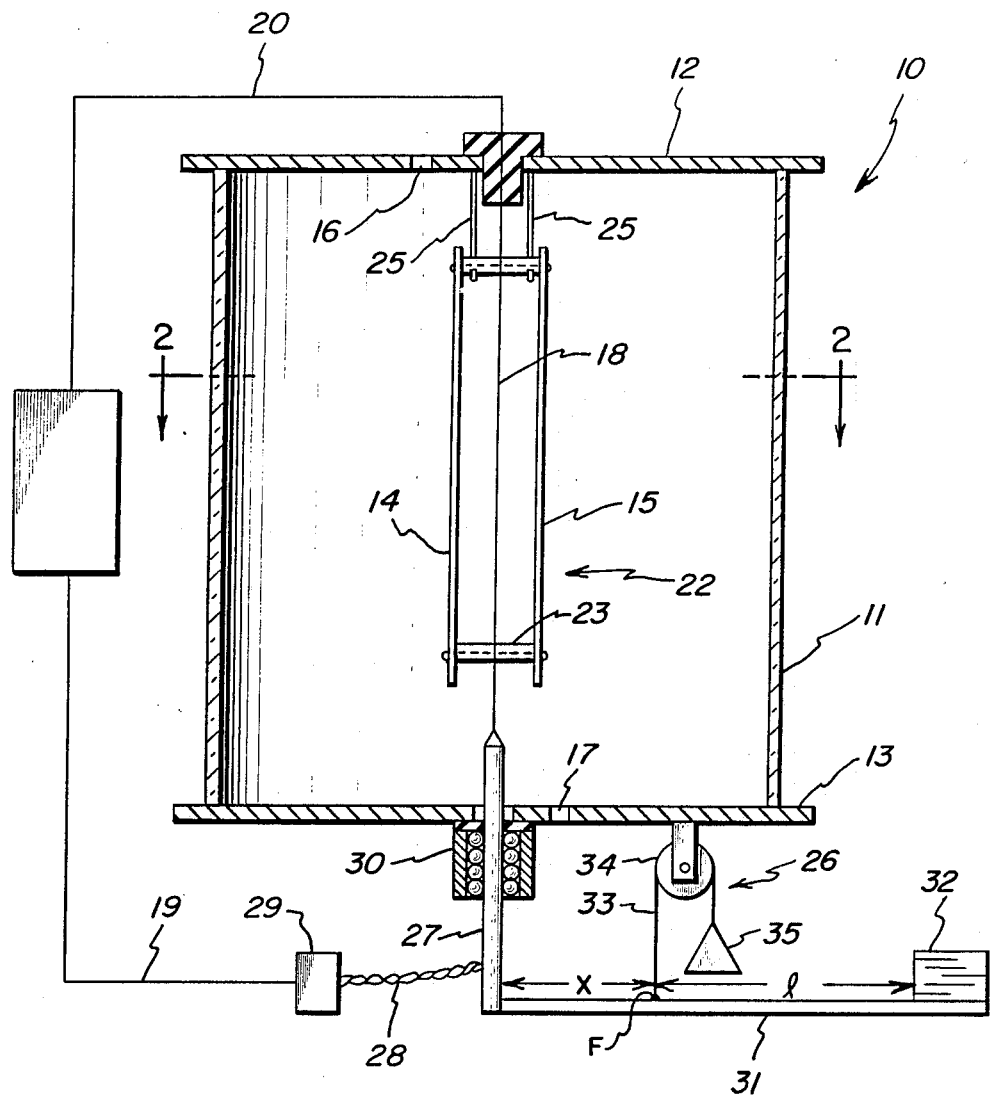
FIG. 1 is a schematic cross-sectional illustration of one preferred apparatus useful in the practice of this invention.
Figure 2:
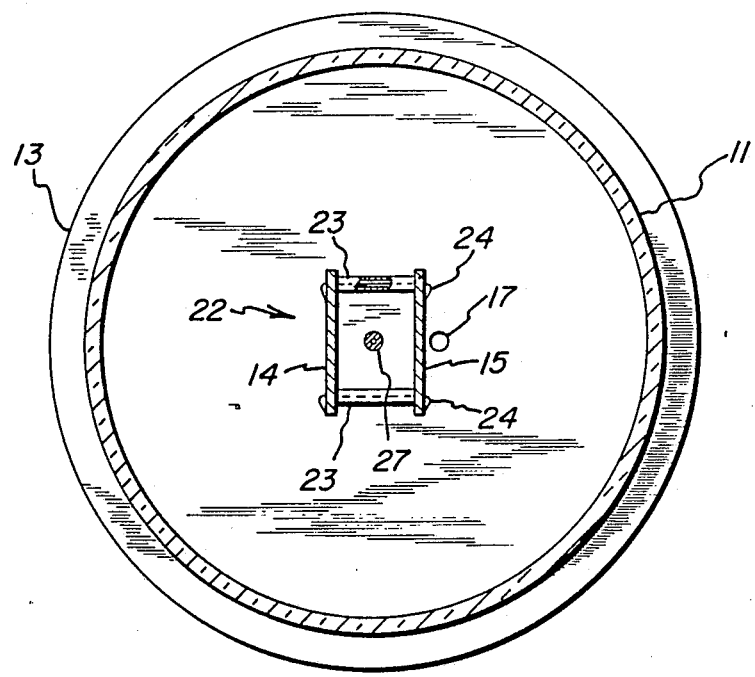
FIG. 2 is a schematic and top view of the apparatus of FIG. 1 taken along the line 2—2 thereof.

An apparatus in which this invention may be expeditiously practiced is illustrated in FIG. 1. Referring now to FIG. 1, apparatus 10 comprises a hollow cylindrical reaction chamber 11, of a high temperature resistance material such as quartz, with opposite closed end walls 12 and 13. Positioned coaxially in chamber 11 in spaced apart, planar, and opposite parallel relationship is a pair of rectangular substrate plates or panels 14 and 15. Panels 14 and 15 are suspended in parallel relationship at a predetermined fixed spacing from each other so that a gas entering chamber 11 through gas inlet 16 in closed end 12 may flow between plates 14 and 15 to exit from chamber 11 through gas exit aperture 17 in closed end 13. Between plates 14 and 15, parallel therewith, and spaced equidistantly therefrom is an electrical resistance heater in the form of a small diameter straight tungsten wire filament 18. Heater filament 18 is connected by means of electrical leads 19 and 20 to a source of direct current, DC, electrical power 21. Filament 18 is retained in predetermined spaced relationship from substrate panels 14 and 15 coextensively along the length of panels 14 and 15. Panels 14 and 15 may be maintained in the parallel fixed spaced apart relationship as shown, by being joined in a subassembly which is placed in chamber 11. Such a subassembly is more clearly illustrated in FIG. 2 as subassembly 22. In FIG. 2, subassembly 22 comprises a pair of rectangular panels 14 and 15 placed in planar juxtaposed position and retained in spaced apart parallel relationship by means of a short, small diameter quartz tube section 23 positioned at each corner of one panel such as panel 14 to extend perpendicularly from the plane of the panel to engage a complementary corner of the opposite panel 15 in perpendicular relationship. A small aperture is provided at each panel corner in axial alignment with the tube section 23. A short length of small diameter metal wire 24 such as tungsten wire, is inserted through one aperture in one panel to extend through the tube section 23 and project from the opposite aperture in the opposite panel. The ends of the wire 24 are bent over to retain the wire in the tube sections 23 and to fasten panels 14 and 15 to the tube sections while at the same time to fasten the tube sections to the panels. The length of tube sections 23 fixes the spaced apart dimension of the panels 14 and 15 in subassembly 22. Subassembly 22 with its plural substrate panels 14 and 15 may be conveniently hung from small J hook supports 25 as illustrated in FIG. 1.

In a practice of this invention, a predetermined gas mixture, for example, a hydrogen/hydrocarbon gas mixture of hydrogen and methane, is caused to flow into chamber 11 through gas inlet 16 in closed end 12 and to flow unimpeded between panels or plates 14 and 15 along and in contact with heater 18, and to exit from chamber 11 through a gas exit 17 in closed end 13. Heater 18 is provided with sufficient electrical current from source 21 to cause it to become incandescent. Under these conditions the flow of gas comes into contact with and is activated by incandescent heater 18. The gas flow also comes into contact with panels 14 and 15 which are cooler than heater 18 to cause diamond crystal nucleation and growth on panels 14 and 15, particularly on those opposite surfaces directly exposed to heater filament 18. Panels 14 and 15 serve as plural substrate surfaces in CVD apparatus 10, and both are served by a single heater filament 18. Panels 14 and 15 contain or are manufactured from those materials which are conducive to diamond nucleation and growth in a CVD process. Among the preferred materials are metals which are strong carbide formers in the presence of high temperature and a high carbon content gas. The refractory metals represent a class of metals useful for panels 14 and 15, and molybdenum has been utilized with good results. In one example, panels 14 and 15 were rectangular molybdenum strips measuring 9.0 inches by 1.25 inches by 1/16 inch thick. Other materials which favorably affect diamond crystal nucleation and growth may be utilized with or combined with panels 14 and 15. Examples of such materials are boron and carbon. The CVD substrate may be preconditioned by being subjected to an elevated temperature, for example 900 degrees C., while submersed in a high carbon content gas such as methane. This treatment saturates the substrate with carbon to minimize excess diffusion of carbon, from the gas in the CVD gas mixture into the substrate material. The noted diffusion is believed to detract from the available carbon for use in the diamond crystal growth process. However, the graphite form of carbon has been found to promote diamond nucleation, and diamond crystal nucleation has been found to prefer areas of a substrate which have been marked with graphite. Boron has also been found to be a significant diamond crystal nucleation and growth enhancer. Both mass yield and crystal size are increased by the use of boron on a substrate. A convenient application of boron to panels 14 and 15 comprises mixing small particle size elemental boron in a liquid carrier such as ethanol and coating an area of a substrate with the mixture. In the practice of the present invention, the opposing surfaces of panels 14 and 15 were coated with the described combination of fine particle boron, having an average particle size of about 0.5 $\mu$, in an ethanol carrier.

During practice of the CVD diamond process, heater filament 18 remains at its incandescent temperature subject to some temperature variations brought on by environmental conditions such as minor equipment variations and the like. Temperature variations, particularly during start up from room temperature, cause the heater filament 18 to be subjected to temperature induced stresses causing flexing and coiling of the filament 18 with resultant changes in the spacing between the heater filament and plates 14 and 15. For best results, heater filament 18 should be maintained in a fixed spaced relationship to panels 14 and 15. For example, a spacing of about 8.0 mm. has been found to provide good results. Since heater filament 18 is maintained at its incandescent temperature, its intrinsic strength is significantly reduced, and attachment of devices intending to maintain the described spaced relationship tend to cause filament breakage and a short useful life. As a consequence, in one embodiment of this invention a very precise torque and leverage means in the form of a weight balancing assembly is utilized to maintain the spaced distance of heater filament 18 constant along the length of panels 14 and 15. One example of a weight balancing system employed in the present invention is illustrated in FIG. 1 as a weight balancing assembly 26. Assembly 26 and its functional application are best described with respect to FIGS. 3 and 3A.

Figure 3:
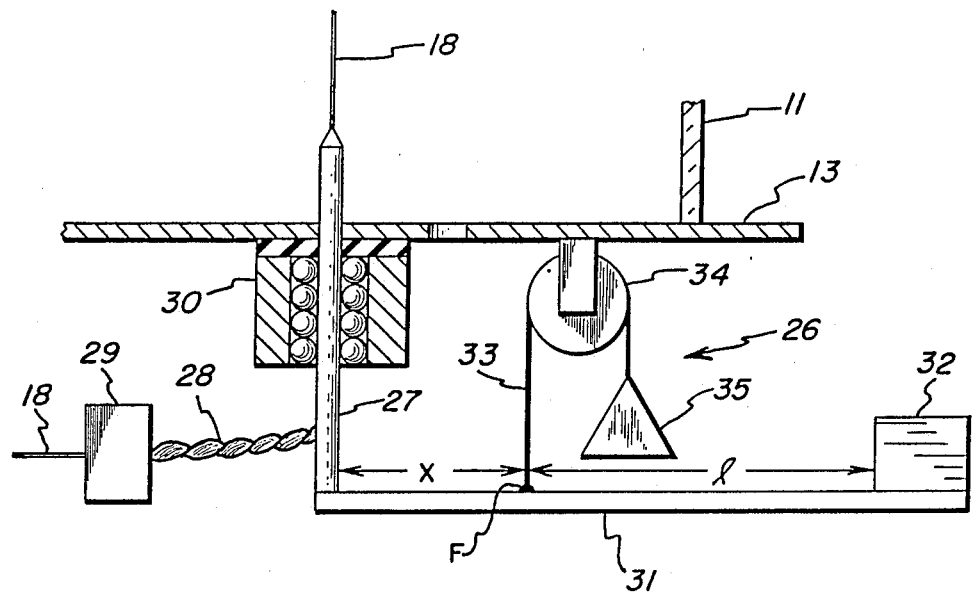
FIG. 3 is a separate schematic illustration of a weight balancing system utilized in the FIG. 1 apparatus.

Referring to FIG. 3, counterbalancing weight assembly 26 comprises a filament rod member 27 which extends into reaction chamber 11 through closed end 13. One end of heater filament 18 is connected to rod 27 within chamber 11 while a very flexible copper braid electrical conductor 28 is electrically connected to rod 27 at a location outside of chamber 11 and to a terminal connector 29. Rod 27 is adapted to slidably project axially and reciprocally into reaction chamber 11 through a low friction rolling element bearing 30. Connected to the end of rod 27 outside of chamber 11 is a laterally extending lever arm 31. The free end of lever arm 31 supports a predetermined mass 32. Between mass 32 and rod 27 is a fulcrum point designated F to which a cable 33 is attached. Cable 33 extends over a pulley member 34, which is attached to and suspends from closed end 13 to depend therefrom in a direction perpendicular to lever arm 31, and supports a counterweight mass 35. The distance along lever arm 29 from fulcrum point F to rod 27 is designated as X, and the distance along lever arm 31 from the fulcrum point F to the center of mass 32 is designated as 1. As illustrated, cable 33 supports the combined weight of mass 32 and rod 27. The use of some initial weight such as incorporated in the mass of rod member 27, appropriately counterbalanced, has been found convenient to assist in maintaining heater wire 18 in a straight condition for proper spacing from plates 14 and 15 during the term of a practice of this invention which includes a range of temperature for heater 18 from room temperature to incandescent temperature. When heater 18 reaches incandescent temperature, its tensile strength is significantly diminished, and relatively small tensile forces on heater filament 18 are sufficient to cause excessive elongation and breakage. Accordingly, the primary purpose of the weight balancing assembly 26 is to reduce flexing, curling, and excessive elongation of heater 18 through a reduction of tensile force on heater filament 18 to essentially zero when heater filament 18 is at its incandescent temperature. This feature is achieved by reducing the mathematical moment on rod 25 to essentially zero by appropriate selection of masses 32 and 35 in accordance with the Force Diagram of FIG. 3A.

Figure 3A:
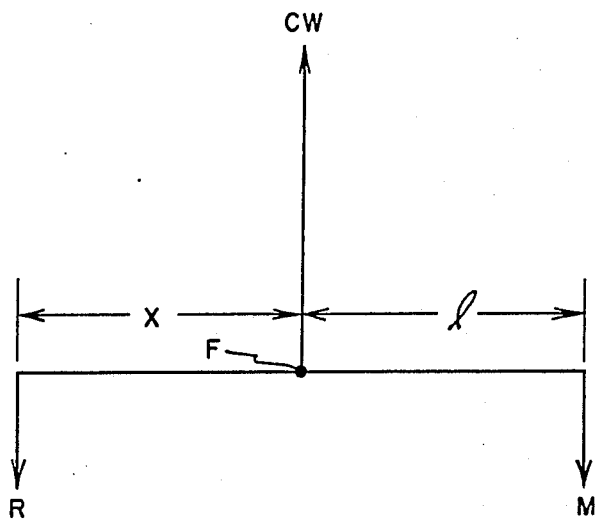
FIG. 3A is a schematic force diagram corresponding to the weight balancing system of FIG. 3.

Referring now to FIG. 3A, an application of appropriate weight and torque principles leads to the following:

Rx=Ml and Cw=R+M where

R=weight of rod 27 x=distance along ram 31 from F to rod 27

M=weight of mass 32 l=distance along arm 29 from F to mass 32

Cw=counterweight 35 acting on lever arm 31 through cable 33 at fulcrum point F.

The use of weight balancing assembly 26 of FIG. 3 with the analysis of FIG. 3A provides means to retain incandescent heater 18 in proper continuous spaced relationship from plates 14 and 15 axially therealong. As an alternative, an appropriate system of spring biasing means may be employed to reduce the tension on heater filament 18 to 0 at its incandescent temperature while maintaining a predetermined spaced distance between heater filament 18 and substrate panels 14 and 15.

The use of direct current, DC, electrical power is also an important factor for a longer useful life for heater filament 18. The use of AC, alternating current, electrical power introduces deleterious vibration in the filament leading to a shorter useful life. Such vibration is related to the originating electrical power generating frequency, ordinarily referred to as 60 cycle power having an alternating frequency of 60 cycles per second.

The use of DC power avoids the introduction of AC cycle vibration into filament 18. In addition to the utilization of DC electrical power for filament 18, power source 21 is assembled or electrically connected so that filament 18 is maintained at a negative electrical bias as a potential aid to extend the life of filament 18 and to improve the nucleation and growth of diamond crystals on the substrate panels.

A CVD process was carried on repetitively in the apparatus of FIG. 1. In each process, heater filament 18 was maintained at its incandescent temperature. A gas mixture of about 99.0% by volume, hydrogen and about 1.0% by volume, methane was introduced into reaction chamber 11 to cause a gas flow therein in the range from about 0.5 cc./min. to about 3 cc./min. The surfaces of panels 14 and 15 exposed to heater filament 18 were coated with liquid ethanol containing fine particle boron of an average particle size of 0.5µ. Operating parameters of gas mixture constituents and proportions, gas flow rate, and electrical power input to heater 18 were retained constant for each process for periods of a few hours to about 100 days. As a result of each process the boron coated surfaces of panels 14 and 15 were found to be coated with a diamond layer of from about 2 µm to 1 mm thickness for the longest process term. This diamond layer mechanically delaminated from substrate panels 14 and 15 during cooling as integral, cohesive, self-supporting diamond sheets or strips. It is believed that the sheets or strips more easily delaminate from substrate panels 14 and 15 because, as one reason, of the presence of boron on the surfaces of panels 14 and 15. Not all of the boron is taken up in the process, and the remainder prevents a tight bond between the diamond layer and the panels 14 and 15. A closer examination of diamond sheets of this invention indicates the sheets to be polycrystalline and very highly wear resistant with no significant cleavage planes or soft wear directions. Diamond sheets have been obtained which included planar surface areas. Thinner sheets or sections of less than about 50 µm thickness were of a grey-like color with some transluscence characteristics. In one practice of this invention, predetermined linear grooves were formed in the surfaces of plates 14 and 15 on which a diamond layer was to be produced. After the layer was produced and removed from its substrate surface, it was found that the grooves acted as a mold to the diamond layer so that the groove geometry was reproduced on the diamond layer or sheet. At the same time the diamond sheet could be easily broken cleanly along the groove lines in the diamond layer so that a sheet of a predetermined shape may be provided by this invention. This invention provides an improved CVD apparatus conducive to diamond nucleation and growth in polycrystalline sheet form.

While this invention has been disclosed and described with respect to preferred embodiments, it will be understood by those skilled in the art that various changes and modifications may be made without departing from the spirit and scope of the invention as set forth in the following claims.

What is claimed is:

1. An apparatus adapted for use in the practice of a CVD process comprising in combination
   (a) a reaction chamber having opposite upper and lower closed end walls,
   (b) a gas inlet and exhaust means in said end walls to introduce a gas into said chamber and to withdraw gas therefrom,
   (c) a vertical pair of parallel spaced apart planar oppositely facing substrate surfaces suspended from the upper closed end wall of the reaction chamber and positioned in said reaction chamber so that gas from said gas inlet means may flow between said surfaces and exit from said gas exhaust means,
   (d) vertical heater means positioned between said substrate surfaces and spaced therefrom a predetermined distance coextensive with said surfaces to heat the gas flowing between said surfaces, and
   (e) weight balancing means, for maintaining the spaced relationship of the vertical heater means from the surfaces, suspended from the upper closed end wall of the reaction chamber by means of a cable passing over a pulley member attached to the lower closed end wall of the reaction chamber.

2. The invention as recited in claim 1 wherein said heater means comprises a straight filament electrical resistance heater positioned to be coextensively spaced from said substrate surface members.

3. The apparatus recited in claim 2 wherein the filament is a small diameter tungsten wire.

4. The invention as recited in claim 3 wherein said wire has one end connected to an electrical lead which is connected to a source of electrical power and the other end is connected to and suspends a rod member so that the mass of the rod assists in keeping the metal wire in a straight line between and coextensively spaced from said substrate surfaces.

5. The invention as recited in claim 1 wherein said weight balancing means comprises:
   (a) a lever arm attached to said rod and extending laterally therefrom with a free end,
   (b) a predetermined mass resting on said free end to be supported thereby,
   (c) a flexible cable means attached to said lever arm intermediate said rod and said mass as a fulcrum support.

6. The apparatus of claim 4 wherein the cable is attached to a counterweight mass to support the lever arm at the fulcrum.

7. The invention as recited in claim 4 wherein said filament is connected to a source of direct current electrical power.

8. The invention as recited in claim 4 wherein said filament is connected to a source of direct current electrical power to provide an electrically negative bias to said filament.

* * * * *